(12) United States Patent  (10) Patent No.: US 7,428,712 B1
Singh et al.  (45) Date of Patent: Sep. 23, 2008

(54) DESIGN OPTIMIZATION USING APPROXIMATE REACHABILITY ANALYSIS

(75) Inventors: Vinaya Kumar Singh, Noida (IN); Ravi Prakash, Noida (IN); Alok Jain, Noida (IN); Kavita Ravi, Chelmsford, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 305 days.

(21) Appl. No.: 11/281,426

(22) Filed: Nov. 18, 2005

(51) Int. Cl.
*G06F 17/50* (2006.01)
(52) U.S. Cl. .................................. 716/2; 716/4; 716/5
(58) Field of Classification Search ............... 716/2, 716/4–5; 714/739, 741, 38, 39, 724; 703/2, 703/17, 22; 702/118
See application file for complete search history.

(56) References Cited

U.S. PATENT DOCUMENTS 6,324,496 B1 * 11/2001 Alur et al. ................... 703/17
6,885,983 B1 * 4/2005 Ho et al. ..................... 703/14
7,076,712 B2 * 7/2006 Prasad et al. ................ 714/739
7,149,987 B2 * 12/2006 Zhu et al. .................... 716/4
7,246,331 B2 * 7/2007 Ward ........................... 716/4

* cited by examiner

*Primary Examiner*—Vuthe Siek
(74) *Attorney, Agent, or Firm*—Rosenberg, Klein & Lee

(57) ABSTRACT

Aspects of computing design invariants, by using approximate reachability analysis, include reducing the circuit model for verification and synthesis. Further included is computing invariants using approximate reachability analysis to optimize a circuit model by identifying a plurality of next states for a present state, the plurality of next states capable of being reached from the present state in one transition. The plurality of bits of the next states are compared with a plurality of bits of the present state, and each bit of the present state that is different from at least one next state is changed to variant.

17 Claims, 4 Drawing Sheets

DESIGN OPTIMIZATION USING APPROXIMATE REACHABILITY ANALYSIS

BACKGROUND

The present invention relates to design optimization in formal verification and synthesis using approximate reachability analysis.

The proliferation of integrated circuits (ICs) has increasingly resulted in a demand for added functionalities in the designs of digital systems. The added functionalities may be implemented in ICs, in order to execute additional tasks in their respective applications or environments. These additional functionalities add to the complexity of the circuit. The increase in complexity gives rise to a need for advanced and complex formal techniques for verification and synthesis of circuit models.

One of the techniques used to optimize a circuit model for verification and synthesis is based on symbolic reachability analysis. Symbolic reachability analysis is carried out to identify design invariants in the circuit model. Design invariants are the properties of designs that do not change during the working of the design. A special form of a design invariant is known as a sequential constant. Sequential constants are outputs of sequential logic devices, such as flip-flops, which do not change their value during the execution of the design. One of the traditional methods for symbolic reachability analysis uses the Binary Decision Diagram (BDD) and Boolean Satisfiability (SAT).

The method for identifying invariants, using the above-mentioned technique, is expensive in terms of the time and resources needed. It limits the size of the design on which the technique can be used. The problem of scalability makes this technique unsuitable for use at the chip level of large circuits, and therefore restricts it to block-level designs with only a few thousand state bits. Therefore, the invariants, which come into existence due to the interaction of different blocks, cannot be detected by means of the conventional technique.

In light of the foregoing discussion, a need exists for a technique to identify design invariants that can be extended to the chip level. There is also a requirement for the application of design invariants in verification and synthesis. This would reduce the verification time and enable verification of assertions, without which the system could run out of resources. Moreover, there is an ongoing need to optimize circuits for space, timing and power requirements. The present invention addresses such a need.

SUMMARY

Aspects of computing design invariants, by using approximate reachability analysis, include reducing the circuit model for verification and synthesis. Further included is computing invariants using approximate reachability analysis to optimize a circuit model by identifying a plurality of next states for a present state, the plurality of next states capable of being reached from the present state in one transition. The plurality of bits of the next states are compared with a plurality of bits of the present state, and each bit of the present state that is different from at least one next state is changed to variant.

Approximate reachability analysis on the complete design is accomplished more efficiently with a reduced number of steps, through the present invention, making the analysis less expensive in terms of time and resources. These and other advantages will be fully appreciated in conjunction with the following detailed description and the accompanying drawings.

BRIEF DESCRIPTION OF THE DRAWINGS

Various embodiments of the present invention will hereinafter be described in conjunction with the appended drawings, provided to illustrate and not to limit the present invention, wherein like designations denote like elements, and in which.

DESCRIPTION OF PREFERRED EMBODIMENTS

Various embodiments of the present invention relate to a method and a system for computing invariants by using approximate reachability analysis to optimize a circuit. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
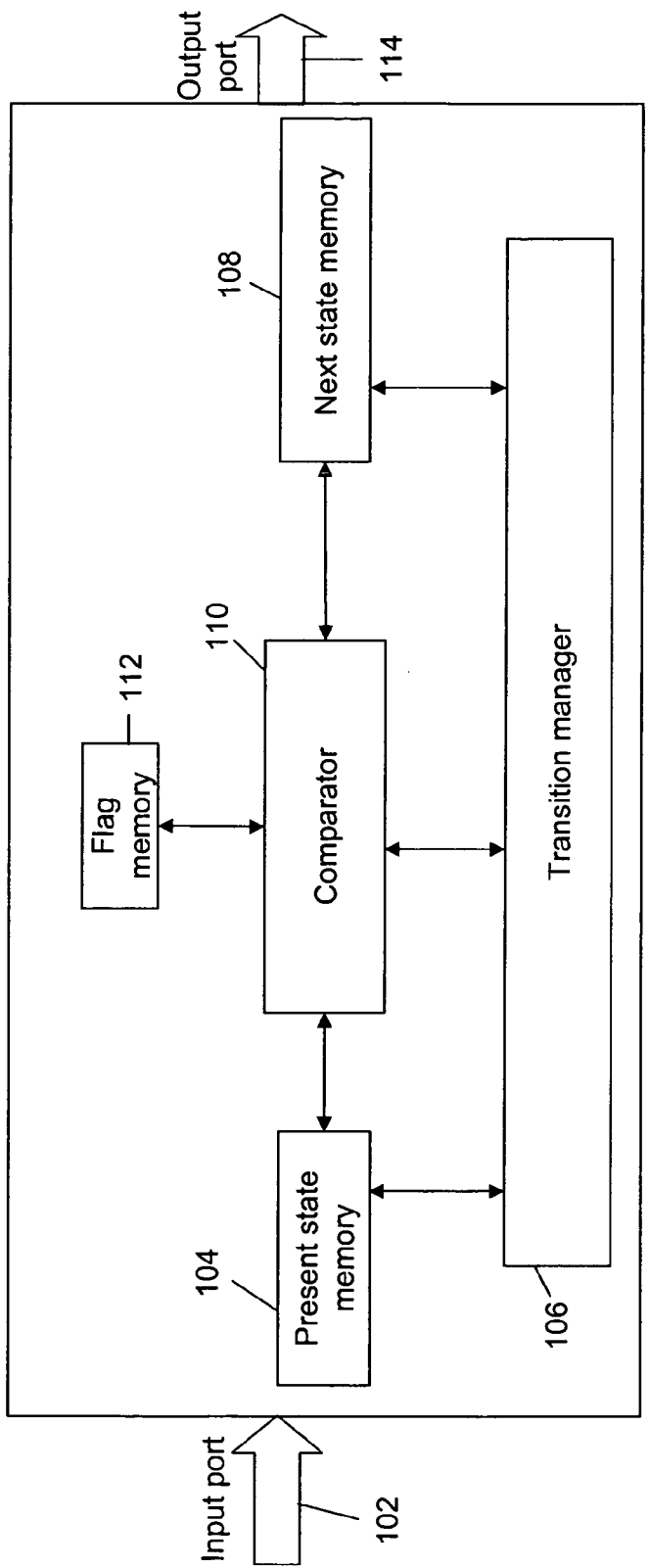
FIG. 1 illustrates a simulator, in accordance with an embodiment of the present invention.

FIG. 1 illustrates a simulator 100, in accordance with an embodiment of the present invention. Simulator 100 comprises an input port 102, a present state memory 104, a transition manager 106, a next state memory 108, a comparator 110, a flag memory 112, and an output port 114. In an embodiment of the present invention, input port 102 can be a group of wires that can transfer data in parallel. The input can be a set of 'all-value', wherein all-value set is a set with values zero and logical one. The all-value set is represented as 'X'. Further, the all-value set for the input covers all the possible input values. The set of present states is stored in present state memory 104. In an embodiment of the present invention, present state memory 104 can be a hard drive, a Random Access Memory (RAM), a register, a compact disk, or any equivalent thereof. The set of next states is calculated from the set of present states corresponding to the input provided by input port 102. The set of next states is calculated by transition manager 106. Further, transition manager 106 performs monotonic next state function computation, which uses ternary logic. In an embodiment of the present invention, transition manager 106 can be a software module, a hardware module, or a combination of both. In an embodiment, transition manager 106 uses symbolic simulation, ternary simulation, binary decision diagram (BDD) or SAT, wherein SAT refers to a set of all satisfiable Boolean expressions. Further, the set of next states is stored in next state memory 108. In accordance with an embodiment of the present invention, next state memory 108 can be a hard drive, a Random Access Memory (RAM), a register, a compact disk, or any equivalent thereof.

Comparator 110 compares the state bits of the present states within the set of present states with the state bits of the next states. In accordance with an embodiment of the present invention, comparator 110 can be a software module, a hardware module, or a combination of both. Additionally, comparator 110 can check flag memory 112, which is checked to determine whether a fixpoint has been reached. A fixpoint is reached when no bit of the present states is different from the corresponding bit of the any of the next states. Output port 114 outputs invariants of the design once a fixpoint is reached. In an embodiment of the present invention, output port 114 can be a group of wires that can transfer data in parallel, or an output device. Further, transition manager 106 calculates a set of next states if the fixpoint has not been reached. Moreover, comparator 110 can change the bits in flag memory 112 and present state memory 104.

Figure 2:
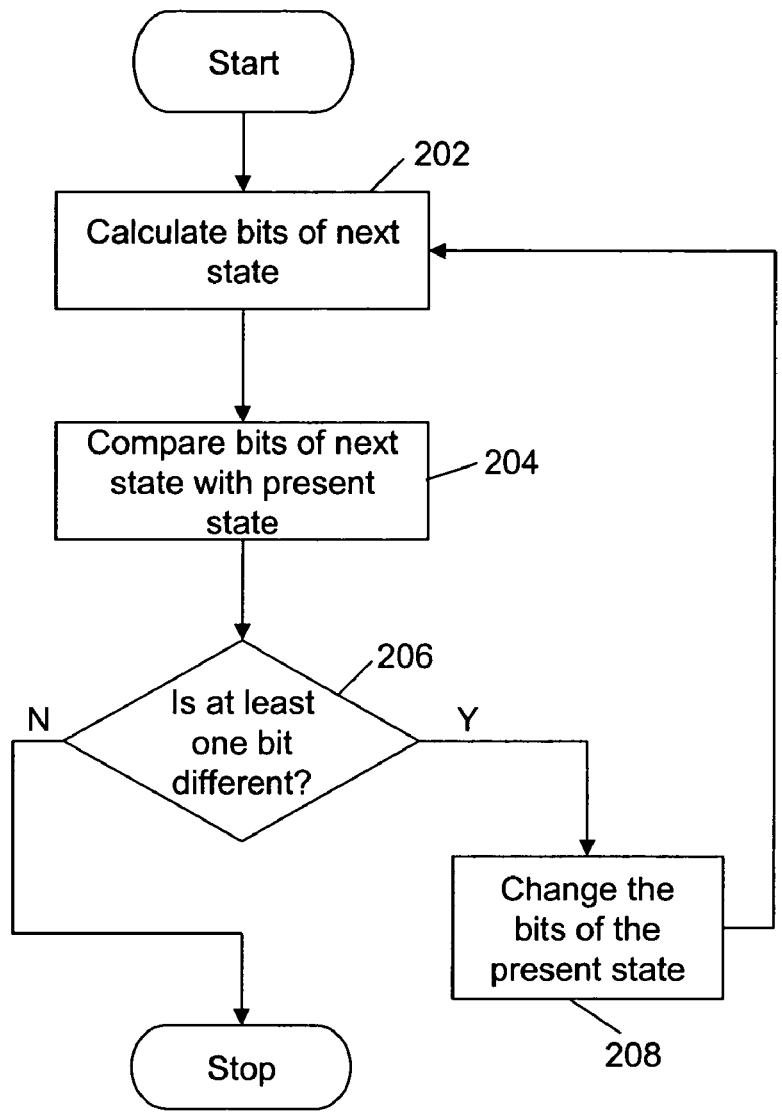
FIG. 2 illustrates a flowchart of a method for computing invariants by using approximate reachability analysis, in accordance with an embodiment of the present invention.

FIG. 2 illustrates a flowchart of a method for computing invariants by using approximate reachability analysis, in accordance with an embodiment of the present invention. At act 202, a plurality of next state bits is calculated. In an embodiment of the present invention, the next states are calculated by transition manager 106 using a monotonic next state function. In accordance with an embodiment of the present invention, the set of next states is stored in next state memory 108. The set of next states includes the states that can be reached from the set of present states in one transition corresponding to the input provided by input port 102. The input on input port 102 represents a set of all possible input values. The set of present states is stored in present state memory 104. At act 204, the next states bits are compared with the present state bits. In an embodiment of the present invention, comparator 110 compares the set of next states stored in next state memory 108 with the set of present states stored in present state memory 104. At act 206, a check is performed to identify whether at least one bit is different. If at least one bit of a next states is different from that of the present state, then act 208 is performed. At act 208, bits of the present state that are different from the corresponding next state bits are changed to 'X', wherein X is a set of all-value, also referred to as a variant. The bits are not changed again once they are changed to X, a set of all-value. In an embodiment of the invention, results from comparator 110 can change bits in the present state to X. Act 202 is performed after act 208. The iteration from act 202 to act 208 is performed until the condition at act 206 is false. At act 202, if no bit of any next state is different from that of the corresponding bit of any present state, then a fixpoint has been reached. At the fixpoint, the invariants present in the circuit are extracted. These extracted invariants in one embodiment can be sequential constants that can be replaced by combinational constants.

Figure 3:
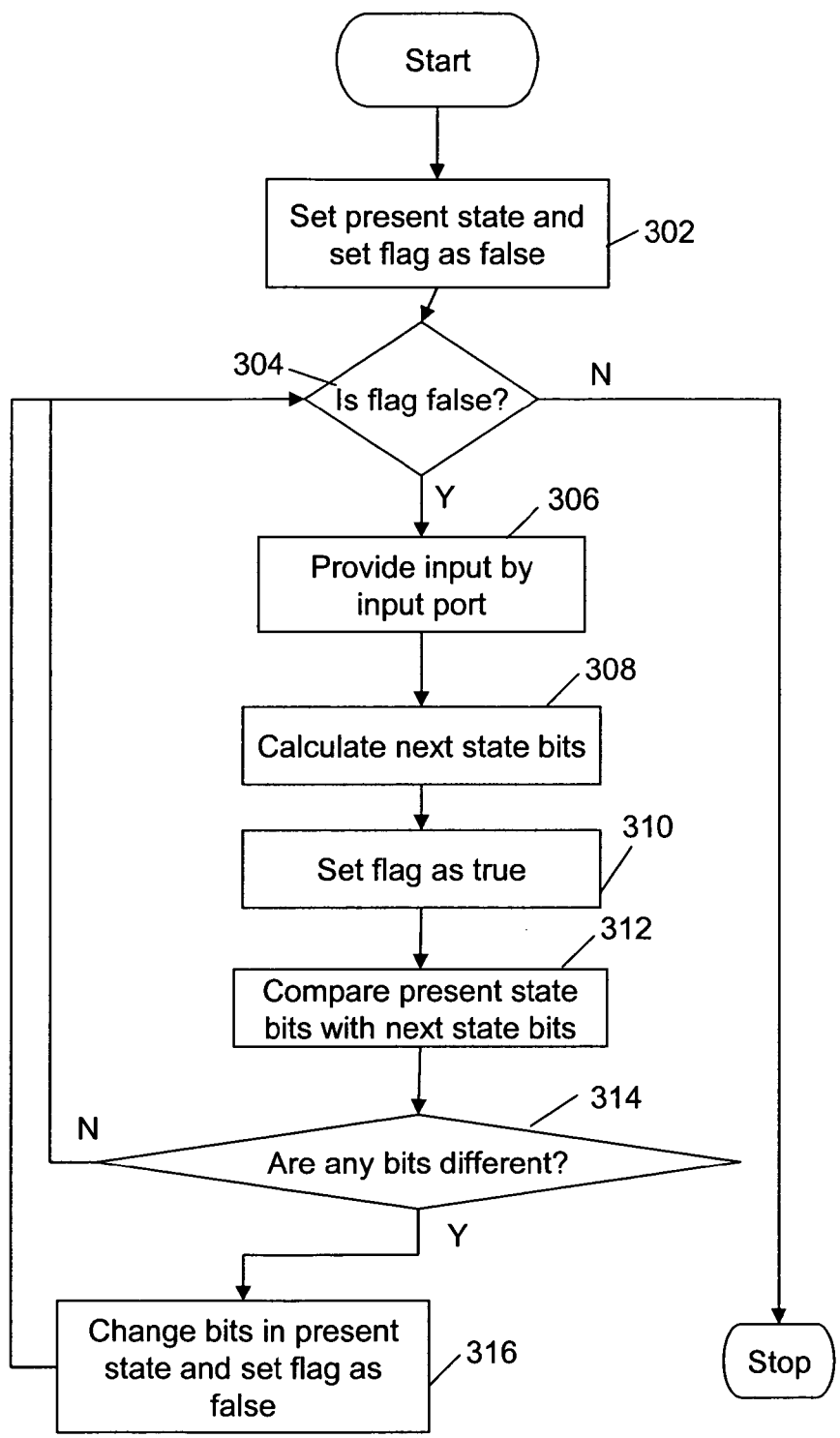
FIG. 3 illustrates a flowchart of a method for computing invariants by using approximate reachability analysis, in accordance with an alternate embodiment of the present invention.

FIG. 3 illustrates a flowchart of a method for computing invariants by using approximate reachability analysis, in accordance with an alternate embodiment of the present invention. At act 302, a set of present states is set to the initial state, and flag memory 112 is set to 'false'. For example, the initial state is stored in present state memory 104. Flag memory 112 is set by comparator 110. Flag memory 112 is checked at act 304. In an embodiment of the invention, comparator 110 checks flag memory 112. In an embodiment of the present invention, if flag memory 112 is true at act 304, then a fixpoint is reached and invariants are extracted from the circuit model being verified. The invariants in one example can be sequential constants. These invariants are reported through output port 114.

If flag memory 112 is false, then act 306 is performed. At act 306, input bits are provided to calculate the next states. For example, input bits are provided by input port 102. At act 308, based on input bits provided by input port 102, and the set of present states stored in present state memory 104, transition manager 106 calculates the set of next state bits by using a monotonic next state function. The set of next state bits can be stored in next state memory 108. At act 310, flag memory 112 is set as true. Comparator 110 can set flag memory 112 as true. At act 312, bits of present states are compared to the bits of next states. In an embodiment of the present invention, comparator 110 compares bits stored in present state memory 104 to bits stored in next state memory 108. In accordance with an embodiment of the present invention, the $i_{th}$ bit of present state memory 104 is compared to the $i_{th}$ bit of next state memory 108. Further, 'i' can vary from zero to 'n−1', wherein 'n' is the number of state bits in the circuit model. At act 312, if not even a single bit is different, then act 304 is performed. If at least one bit is different, then act 316 is performed. At act 316, bits of the set of present states that are different from the corresponding set of next state bits are changed to X, i.e., a variant. For example, if the $i_{th}$ bit of any of the present states is different from the $i_{th}$ bit of at least one of the next states, then the $i_{th}$ bit of each of the present states is changed to X. The bit, once it is changed to X, is not changed again. Further, flag memory 112 is set to false by comparator 110. Acts 304 to 316 are performed iteratively until the condition is false at act 304. If the condition is false at act 304, then sequential constants are extracted from the circuit model. In accordance with an embodiment of the present invention, sequential constants can be changed to combinational constants, to optimize the circuit model. Further, the complete algorithm for finding invariants is completed in O(n) steps, O(n) being a function of the order n, wherein n represents the number of state bits in the circuit model.

In accordance with an embodiment of the present invention, the method for computing invariants by using approximate reachability analysis can be practiced, for example, by using the following pseudo-code:

csimFixPoint(M)
$\vec{C} = S_0$; converged = false;
while(!converged)
for each i, $N_i = \hat{\delta}_i(\vec{v} = \vec{C}, \vec{w} = \vec{X})$;
converged = true;
for each i
if ($N_i \neq C_i$)
$C_i = X$; converged = false;
return $\vec{C}$;

In the pseudo-code given above:
$\vec{C}$ is the present state memory 104.
$S_o$ is the initial state.
Converged is flag memory 112.
$N_i$ is the next state memory 108.
$\vec{w}$ is the input provided by input port 102.
M is the circuit model.
$\hat{\delta}_i$ is transition manager 106.
X is a set of all-value.
$\vec{v}$ is a variable that is assigned the value of $\vec{C}$.

In the pseudo-code given above, present state memory 104 is initialized to the initial state and flag memory 112 is set to false. Further, flag memory 112 is checked to verify the condition of the iterative loop. If flag memory 112 is false, the loop is traversed. Further, for each bit of present states, the corresponding bits of the next states are calculated, corresponding to the all-value inputs provided by input port 102. Additionally, flag memory 112 is set to true. In the next step, each bit of the present states is compared to the corresponding bit of the next states. If a bit of the present state is different from the corresponding bit of any of the next state, then the bit is changed to X. For example, if the ith bit of a present state is different from the ith bit of at least one of the next states, then the ith bit of each of the present states is changed to X. Additionally, flag memory 112 is set to false and the iterative loop is traversed again. The complete algorithm for finding an invariant is completed in O(n) steps, O(n) being a function of order n, wherein n is the number of state bits in the circuit model.

Figure 4:
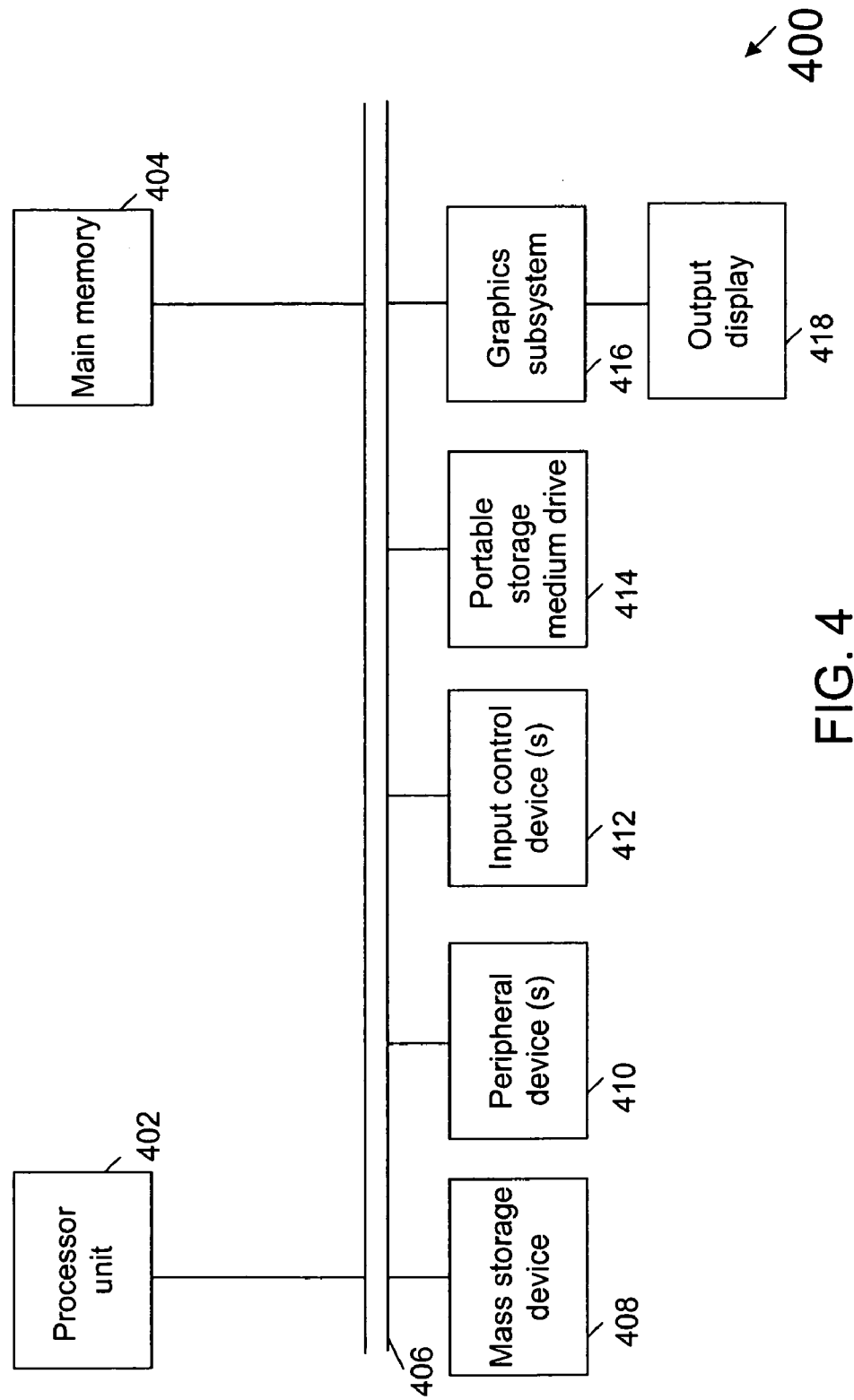
FIG. 4 illustrates a block diagram of a general-purpose computer system for executing electronic design automation (EDA) software, in accordance with various embodiments of the present invention.

FIG. 4 is a block diagram illustrating a general-purpose computer system for executing EDA software, in accordance with an alternate embodiment of the present invention.

A computer system 400 contains a processor unit 402, a main memory 404, an interconnect bus 406, a mass storage device 408, at least one peripheral device 410 (hereinafter referred to as peripheral devices(s) 410), at least one input control device 412 (hereinafter referred to as input control device(s) 410), at least one portable storage medium drive 414 (hereinafter referred to as portable storage medium drive (s) 414), a graphics subsystem 416, and an output display 418. Processor unit 402 can include a single microprocessor or a plurality of microprocessors, to configure computer system 400 as a multi-processor system. Further, processor unit 402 can run the algorithm for the method for computing invariants by using approximate reachability analysis. Main memory 404 stores, in part, instructions and data to be executed by processor unit 402. Additionally, main memory 404 can store the set of present state and the set of next states. In an embodiment of the present invention, main memory 404 can include banks of dynamic random access memory (DRAM) as well as high-speed cache memory.

For the purpose of simplicity, all the components of computer system 400 are connected via interconnect bus 406. However, computer system 400 may be connected through one or more data transport means. By way of example, processor unit 402 and main memory 404 may be connected via a local microprocessor bus; and mass storage device 408, peripheral device(s) 410, portable storage medium drive(s) 414, and graphics subsystem 416 may be connected via one or more input/output (I/O) buses. Mass storage device 408, which can be implemented with a magnetic disk drive or an optical disk drive, is a non-volatile storage device for storing data and instructions, used by processor unit 402. In the software embodiment, mass storage device 408 stores the software, to load it to main memory 404.

Portable storage medium drive 414 operates in conjunction with a portable non-volatile storage medium such as a floppy disk or a compact disc read-only memory (CD-ROM), to input and output data and code to and from computer system 400. In one embodiment, the software is stored in such a portable medium and is input to computer system 400 via portable storage medium drive 414. Peripheral device(s) 410 can include any type of computer support device, such as an input/output (I/O) interface, to add additional functionality to computer system 400. For example, peripheral device(s) 410 can include a network interface card, to interface computer system 400 to a network.

Input control device(s) 412 provide a portion of the user interface for a computer system 400 user. Input control device(s) 412 may include an alphanumeric keypad for inputting alphanumeric and other key information; a cursor control device such as a mouse, a trackball or stylus; or cursor direction keys. In order to display textual and graphical information, computer system 400 contains graphics subsystem 414 and output display 418. Output display 418 may include a cathode ray tube (CRT) display or a liquid crystal display (LCD). Graphics subsystem 416 receives textual and graphical information, and processes the information for output-to-output display 418. The components of computer system 400 are those that are typically found in general-purpose computer systems, and, in fact, these components are intended to represent a broad category of such computer components that are well known in the art.

For software implementation, the EDA software includes a plurality of computer-executable instructions, to be implemented on a general-purpose computer system. Prior to loading it into a general-purpose computer system, the EDA software may reside as encoded information in a computer-readable medium such as a magnetic floppy disk, a magnetic tape or a Compact Disc Read Only Memory (CD-ROM). In one hardware implementation, the EDA software may comprise a dedicated processor with processor instructions for performing the functions described herein. Circuits may also be developed to perform these functions.

As presented herein, the aspects of computing design invariants, by using approximate reachability analysis, include reducing the circuit model for verification and synthesis. This occurs by identifying the design invariants at the chip level by the methods of the present invention. These design invariants are applied on the circuit model to optimize the circuit. For example, a flip-flop, which is a sequential constant, is removed from the circuit. Its output is replaced by a combinational constant. The circuit is further optimized by the propagation of combinational constants. Invariants, which come into existence due to the interaction of the different blocks, are also identified. These invariants are not observed by prior art techniques that identify the invariants separately in each block of the design. Additionally, the present invention reports potential redundancies, errors and excessive constraints being placed on the circuit. These design issues are reported back to the user, for correction. There is no need to write any assertions to highlight these issues in the circuit. Further, the present invention takes into account the initial state of the circuit for synthesis optimization.

Thus, once the sequential constants, i.e., a one literal variable, are changed to combinational constants, the circuit is optimized. This results in improved area timing and power requirement in synthesis. The extracted constants are propagated in the circuit, thereby simplifying the design model provided to a formal verification core engine. Further, the sequential constants obtained by the present invention can also be used to flag potential redundancies, errors and excessive constraints in the circuit model.

Also, the present invention uses the initial state in synthesis optimization. Further, the present invention carries out an approximate reachability analysis on the complete design in O(n) steps, O(n) being a function of order n, wherein n is the number of state bits in the circuit. Moreover, the present invention uses a ternary reachability analysis, making the algorithm-to-extract reachable states less expensive.

Additionally, the present invention enables invariant extraction of chip-level designs, which makes formal verification and synthesis suitable for designs of a large size.

Further, invariants that come into existence, due to the interaction of the different blocks, are identified by means of the present invention. These invariants are not identified by block-level analysis.

A system, as described in the present invention or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the acts of the present invention, including a computer readable medium having computer readable program code embodied therein, as is well understood in the art.

While the preferred embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

What is claimed is:

1. A method for computing invariants using approximate reachability analysis to optimize a circuit model, the method comprising:
   a. identifying a plurality of next states for a present state, the plurality of next states capable of being reached from the present state in one transition;
   b. calculating a plurality of next state bits of the plurality of next states;
   c. comparing each of the calculated next state bits of the plurality of next states with each state bit of a plurality of bits of the present state; and
   d. changing each bit of the present state that is different from at least one next state bit, wherein the changed bit is changed to a variant; and
   e. extracting invariant bits to create combinational constants to reduce a circuit model.

2. The method according to claim 1 further comprising repeating the identifying, calculating comparing, and changing until no more bits of the present state are changed to a variant.

3. The method according to claim 1, wherein the present state comprises an initial state of the circuit model.

4. The method according to claim 1, wherein an input to the present state comprises a set of all-value bits, wherein an all value bit comprises a logic zero and one.

5. The method according to claim 1, wherein invariants comprise sequential constants.

6. A method for computing invariants using approximate reachability analysis to optimize a circuit model, the method comprising:
   a. identifying a plurality of next states for a present state, the plurality of next states capable of being reached from the present state in one transition;
   b. calculating a plurality of next state bits;
   c. comparing each of the calculated next state bits with each state bit of a plurality of bits of the present state; and
   d. changing each bit of the present state that is different from at least one next state, wherein the bit is changed to variant, wherein the act of comparing each of the plurality of bits comprises comparing an $i_{th}$ bit of the present state with the $i_{th}$ bit of each next state, wherein i can vary from zero to n−1, n being the number of state bits in the circuit model.

7. A method for computing invariants using approximate reachability analysis to optimize a circuit model, the method comprising:
   a. identifying a plurality of next states for a present state, the plurality of next states capable of being reached from the present state in one transition;
   b. calculating a plurality of next state bits;
   c. comparing each of the calculated next state bits with each state bit of a plurality of bits of the present state; and
   d. changing each bit of the present state that is different from at least one next state, wherein the bit is changed to variant, wherein a bit once changed to a variant is not changed again.

8. A system for computing invariants using approximate reachability analysis to optimize a circuit model, the system comprising:
   a. means for identifying a plurality of next states for a present state and calculating the plurality of next states bits, the plurality of next states capable of being reached from the present state in one transition;
   b. a comparator for comparing each of a plurality of bits of the present state with each of the calculated next state bits of the identified plurality of next states;
   c. means for changing each bit of the present state that is different from at least one next state bit, wherein the changed bit is changed to a variant; and
   d. means for reporting invariants for creating combinational constants to reduce a circuit model.

9. The system of claim 8 wherein the means for identifying further comprises:
   a. an input port for providing input bits in the present state;
   b. a transition manager for identifying the plurality of next states for the present state using the input bits;
   c. a present state memory for storing the present state; and
   d. a next state memory for storing the plurality of next states of the circuit.

10. The system of claim 8 wherein the means for changing further comprises:
    a. a flag memory for storing a flag, wherein the flag comprises the result of the comparator; and
    b. an output port to provide extracted invariants.

11. The system according to the claim 10 wherein the extracted invariants comprise sequential constants.

12. A computer program storage device stored a computer program product for use with a computer, the computer program product comprising a computer usable medium having a computer readable program code embodied therein for computing invariants using approximate reachability analysis to optimize a circuit model, the computer program code performing:
    a. identifying a plurality of next states for a present state, the plurality of next states capable of being reached from the present state in one transition;
    b. calculating a plurality of next state bits;
    c. comparing each of the calculated next state bits of the identified plurality of next states with each state bit of a plurality of bits of the present state;
    d. changing each bit of the present state that is different from at least one next state bit, wherein the changed bit is changed to a variant, and the identifying, calculating, comparing, and changing are repeated until no more bits of the present state change to variant; and
    e. extracting invariants to create combinational constants to reduce a circuit model.

13. The computer program storage device according to claim 12 wherein, the present state comprises an initial state of the circuit model.

14. The computer program storage device according to claim 12 wherein, an input to the present state comprises a set of all-value bits, wherein an all-value bit comprises a logic zero and one.

15. The computer program storage device according to claim 12 wherein invariants comprise sequential constants.

16. A computer program storage device stored a computer program product for use with a computer, the computer program product comprising a computer usable medium having a computer readable program code embodied therein for computing invariants using approximate reachability analysis to optimize a circuit model, the computer program code performing:

a. identifying a plurality of next states for a present state, the plurality of next states capable of being reached from the present state in one transition;
b. calculating a plurality of next state bits;
c. comparing each of the calculated next state bits of the identified plurality of next states with each state bit of a plurality of bits of the present state; and
d. changing each bit of the present state that is different from at least one next state, wherein the bit is changed to variant, and the identifying, comparing, and changing are repeated until no more bits of the present state change to variant, the instructions for comparing the identified plurality of next states comprises instructions for comparing an $i_{th}$ bit of the present state with an $i_{th}$ bit of each of the next states, wherein i can vary from zero to n−1, n being the number of state bits in the circuit model.

17. A computer program storage device stored a computer program product for use with a computer, the computer program product comprising a computer usable medium having a computer readable program code embodied therein for computing invariants using approximate reachability analysis to optimize a circuit model, the computer program code performing:

a. identifying a plurality of next states for a present state, the plurality of next states capable of being reached from the present state in one transition;
b. calculating a plurality of next state bits;
c. comparing each of the calculated next state bits of the identified plurality of next states with each state bit of a plurality of bits of the present state; and
d. changing each bit of the present state that is different from at least one next state, wherein the bit is changed to variant, and the identifying, comparing, and changing are repeated until no more bits of the present state change to variant, the instructions for changing bits comprises instructions for changing a bit to a variant only once.

* * * * *